United States Patent [19]

Kabelac

[11] 4,414,647
[45] Nov. 8, 1983

[54] BUBBLE DOMAIN REPLICATOR FOR CONTIGUOUS-DISK DEVICES

[75] Inventor: William J. Kabelac, Morgan Hill, Calif.

[73] Assignee: International Business Machines Corporation, Armonk, N.Y.

[21] Appl. No.: 352,735

[22] Filed: Feb. 26, 1982

[51] Int. Cl.³ .............................................. G11C 19/08
[52] U.S. Cl. ...................................... 365/12; 365/36; 365/41
[58] Field of Search .............................. 365/12, 36, 41

[56] References Cited

U.S. PATENT DOCUMENTS 4,253,159  2/1981  Nelson .................................. 365/36
4,360,904  11/1982  Gergis ................................... 365/12

Primary Examiner—James W. Moffitt
Attorney, Agent, or Firm—Joseph E. Kieninger

[57] ABSTRACT

A bubble domain replicator for ion-implanted contiguous disk devices has a cusp portion and a tip portion extending substantially away from the cusp portion so that the cusp forms part of a super track and the tip forms part of a bad track. A hairpin conductor is positioned over the cusp portion and tip portion so that the closed end of the hairpin is closest to and surrounds the end of the tip portion.

7 Claims, 2 Drawing Figures

BUBBLE DOMAIN REPLICATOR FOR CONTIGUOUS-DISK DEVICES

DESCRIPTION

1. Technical Field

This invention relates to ion-implanted contiguous disk bubble devices and more particularly to a bubble replicator.

2. Background Art

The block-replicate architecture which has been widely used in permalloy bubble devices requires the use of a bubble replicator. This type of architecture for major/minor loop organizations in ion-implanted contiguous disk bubble devices, has not been developed due to the lack of a workable bubble replicator. The incorporation of the bubble replicator function on a bubble chip ensures non-volatility, that is information is always contained on the chip, even during a destructive read operation.

In permalloy type devices, the replication functions often are implemented by electrical conductor patterns which are formed beneath the permalloy elements about which bubbles are elongated during bubble propagation in response to cycles of the in-plane field. Successful replication depends upon proper placement of the conductors with respect to the propagation pattern to produce cutting fields at a position across a permalloy element, along which a bubble is elongated or stretched. The ends of the elongated bubble are securely anchored by the strong potential well due to the permalloy replicate element.

With ion-implanted devices, however, it is difficult to elongate and anchor the ends of a bubble domain, solely by the potential well due to the charged wall. The reason for this is that one end of a charged wall extends like a spike outwardly from the propagation elements to occupy varying rather than fixed positions. Further, the end of the spike coupled to the propagation element is mobile. Consequently, the positioning of a replicate conductor astride a bubble elongated by a charge wall has not led to successful replication.

In the patent to Nelson, U.S. Pat. No. 4,253,159, a replicator for ion-implanted magnetic bubble memory includes an offset hairpin geometry. The conductor is associated with features in adjacent bubble paths which exhibit strong attracting poles at the same time. The conductor stretches the bubble between the attracting poles. The bubble is severed by the reorienting propagation field. The ion-implanted regions have alternating different shapes, and the adjoining cusps extend substantially the same amount into the nonimplanted region. This replicator has a low (small) operating margin.

SUMMARY OF THE INVENTION

It is a primary object of this invention to provide an improved bubble replicator for ion-implanted contiguous disk bubble devices.

It is another object of this invention to provide a bubble replicator for ion-implanted contiguous disk bubble devices that has a high operating margin.

These and other objects are accomplished by a bubble replicator having a configuration with a deep cusp and a tip oriented so that the cusp forms part of a super track and the tip forms part of a bad track. A hairpin conductor is positioned over the cusp and end of the tip so that the closed end of the hairpin is closest to and surrounds the end of the tip. The cusp is positioned with one crystallographic axis pointing into the cusp. In a preferred embodiment the length of the cusp to the end of the tip is between 10 to 15 bubble diameters. The end of the closed hairpin is spaced from the end of the tip a distance at least equal to the diameter of the bubble being replicated.

Other objects of this invention will be apparent from the following detailed description, reference being made to the accompanying drawings wherein the specific embodiments of the invention are shown.

DESCRIPTION OF THE PREFERRED EMBODIMENTS

Figure 1:
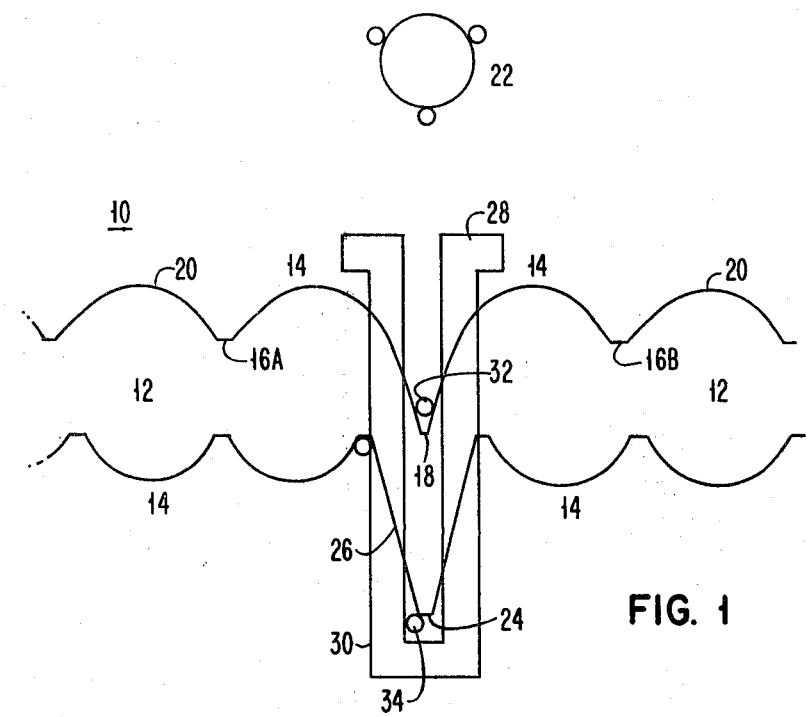
FIG. 1 is a top view of the bubble domain replicator in accordance with this invention.

As shown in FIG. 1, in a preferred embodiment, the ion-implanted contiguous disk bubble replicator 10 includes a nonimplanted region 12 surrounded on two sides by implanted regions 14. Cusps 16A and 16B and deep cusp 18 in the nonimplanted region 12 form part of the track 20. The track 20 is a super track, that is, bubbles propagate readily, in view of the crystallographic orientation 22 of the bubble material (not shown). The cusp 18 is of the order of twice as deep into the region 12 as the adjoining cusps 16A and 16B.

The nonimplanted region 12 has a tip portion 24 that is aligned directly with the deep cusp 18. The tip 24 forms part of a bad track 26 due to the crystallographic orientation 22. The length between the cusp 18 and the end of the tip 24 is between 5 to 20 bubble diameters with the preferred length being between 10 to 15 bubble diameters. For example, in a one-micron bubble device, a length of 10 to 15 microns would be preferable.

A hairpin conductor 28 is centered over the cusp 18 and the tip 24 and oriented such that the closed end 30 of the hairpin 28 is closest to the end of the tip 24. The closed end 30 is spaced from the end of the tip 24 a distance at least equal to the diameter of the bubble being replicated. For example, with a 1 micron bubble the distance is at least 1 micron in length separating the end of the tip from the end of the hairpin.

The replicator 10 operates in the following manner. A bubble 32 is propagated along track 20 and from cusp 16A to cusp 18. When the phase of the rotating field is such that it is substantially directed into the cusp 18, a current pulse is passed through the hairpin conductor 28. The sense of current is chosen so that the field at the center of the hairpin locally lowers the bias field and causes the bubble to stripe out across the nonimplanted region from the cusp 18 to the tip 24. When the current pulse is terminated the stripe becomes unstable and the combined effect of the extended nonimplanted area 12 and the attractive charged walls at the cusp 18 and the tip 24 result in the formation of two bubbles, one in the cusp 18 (still shown as 32) and a replicated bubble 34 on the end of tip 24. As the drive field rotates, the original bubble 32 continues to propagate along track 20 to the cusp 16B while the replicated bubble 34 is carried along the lower track 26.

EXAMPLE No. 1

The replicator design shown in FIG. 1 has been implemented on a composite garnet supporting one micron bubbles. Test data has shown that the replicate function was successful over a bias field range of 29 oe (8.3%) with an error rate better than $10^{-2}$ at 200 kHz rotating field frequency. The operation of the component was found to be insensitive to drive field amplitude in the range of 45 to 60 oe and exhibited a satisfactory current pulse turn on phase tolerance of at least plus or minus 10°. A current pulse amplitude of 125 ma was used.

Figure 2:
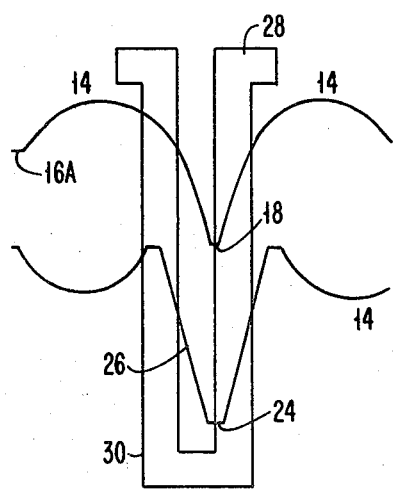
FIG. 2 is a top view of a second embodiment of this invention.

Another embodiment is shown in FIG. 2 where the hairpin conductor 28 is offset in relation to the tip.

Although a preferred embodiment of this invention has been described, it is understood that numerous variations may be made in accordance with the principles of this invention.

What is claimed is:

1. A bubble replicator for ion-implanted bubble devices having:
   a non-implanted region having first and second sides, characterized by
   a cusp portion on said first side extending substantially into the longitudinal plane of said region,
   a tip portion on said second side extending substantially away from the longitudinal plane of said region, said tip portion being in substantial alignment with said cusp portion, and
   a hairpin loop conductor in overying contact with said cusp portion and said tip portion and oriented such that the closed end portion thereof is in spaced surrounding relationship with the end of said tip portion.

2. A bubble replicator as described in claim 1 wherein said cusp portion is positioned so that one crystallographic axis is pointed into the cusp wherein said first side is a super propagation track.

3. A bubble replicator as described in claim 1 wherein the length of the end of said tip portion to the end of said cusp portion is 5 to 20 bubble diameters.

4. A bubble replicator as described in claim 1 wherein the length from the end of said tip portion to the end of the length of said cusp portion is 10 to 15 bubble diameters.

5. A bubble replicator as described in claim 1 wherein said conductor is offset in relation to the tip portion.

6. A bubble replicator as described in claim 1 wherein said cusp portion is based between two adjoining cusps, said cusp portion extending twice as deep into said region as said adjoining cusps.

7. A bubble replicator as described in claim 1 wherin said closed end of said conductor is based from the end of said tip portion a distance at least equal to the diameter of the bubble being replicated.

* * * * *